(12) United States Patent
Carlson (10) Patent No.: US 8,851,442 B2
(45) Date of Patent: Oct. 7, 2014

(54) AEROGEL-BASES MOLD FOR MEMS FABRICATION AND FORMATION THEREOF

(75) Inventor: Robert J. Carlson, Brooklyn Park, MN (US)

(73) Assignee: Honeywell International Inc., Morristown, NJ (US)

(*) Notice: Subject to any disclaimer, the term of this patent is extended or adjusted under 35 U.S.C. 154(b) by 708 days.

(21) Appl. No.: 12/017,944

(22) Filed: Jan. 22, 2008

(65) Prior Publication Data

US 2009/0184088 A1 Jul. 23, 2009

(51) Int. Cl.
*B29C 33/56* (2006.01)
*B81C 1/00* (2006.01)
*B81C 99/00* (2010.01)

(52) U.S. Cl.
CPC ...... *B81C 99/009* (2013.01); *B81C 2201/0143* (2013.01); *B81C 2201/034* (2013.01); *B81C 2201/0132* (2013.01); *B81B 2201/058* (2013.01); *B81B 2203/0127* (2013.01)
USPC ........... 249/116; 249/135; 264/221; 264/338; 264/621; 106/38.2; 427/133; 427/135

(58) Field of Classification Search
USPC ............ 425/385, 470, 810; 249/114.1–116, 249/134–135; 427/133–135; 106/38.2, 106/38.9; 264/219–221, 224, 226, 227, 264/338, 621
See application file for complete search history.

(56) References Cited

U.S. PATENT DOCUMENTS

| | | | |
|---|---|---|---|
| 3,977,993 A * | 8/1976 | Lynch | 423/338 |
| 5,395,805 A * | 3/1995 | Droege et al. | 501/12 |
| 5,409,683 A * | 4/1995 | Tillotson et al. | 423/338 |
| 5,658,832 A * | 8/1997 | Bernhardt et al. | 264/272.11 |
| 5,973,015 A | 10/1999 | Coronado et al. | |
| 6,087,407 A | 7/2000 | Coronado et al. | |
| 6,168,737 B1 * | 1/2001 | Poco et al. | 264/129 |
| 6,270,846 B1 * | 8/2001 | Brinker et al. | 428/64.1 |
| 6,599,953 B1 | 7/2003 | Ratke et al. | |
| 6,679,471 B2 * | 1/2004 | Domeier et al. | 249/60 |

(Continued)

FOREIGN PATENT DOCUMENTS

| | | | |
|---|---|---|---|
| JP | 2006108093 | 4/2006 | |
| JP | 2008006639 A * | 1/2008 | B29C 41/00 |
| WO | 02064496 | 8/2002 | |

OTHER PUBLICATIONS

Krug et al., Fine patterning of thin sol-gel films, Jounal of non-crystalline solids, 147&148 (1992), 447-450.*

(Continued)

*Primary Examiner* — Dimple Bodawala
(74) *Attorney, Agent, or Firm* — Fogg & Powers LLC (57) ABSTRACT

The invention is directed to a patterned aerogel-based layer that serves as a mold for at least part of a microelectromechanical feature. The density of an aerogel is less than that of typical materials used in MEMS fabrication, such as polysilicon, silicon oxide, single-crystal silicon, metals, metal alloys, and the like. Therefore, one may form structural features in an aerogel-based layer at rates significantly higher than the rates at which structural features can be formed in denser materials. The invention further includes a method of patterning an aerogel-based layer to produce such an aerogel-based mold. The invention further includes a method of fabricating a microelectromechanical feature using an aerogel-based mold. This method includes depositing a dense material layer directly onto the outline of at least part of a microelectromechanical feature that has been formed in the aerogel-based layer.

16 Claims, 3 Drawing Sheets

(56) References Cited

U.S. PATENT DOCUMENTS

| | | | |
|---|---|---|---|
| 6,740,416 B1* | 5/2004 | Yokogawa et al. | 428/446 |
| 6,887,915 B2 | 5/2005 | Ratke et al. | |
| 7,226,146 B2 | 6/2007 | Chen et al. | |
| 7,473,932 B2 | 1/2009 | Cho et al. | |
| 8,214,980 B2* | 7/2012 | Bullock et al. | 28/107 |
| 8,226,839 B1* | 7/2012 | Reed | 216/41 |
| 2002/0160153 A1* | 10/2002 | Minami et al. | 428/156 |
| 2002/0196521 A1* | 12/2002 | Little et al. | 359/290 |
| 2003/0025225 A1* | 2/2003 | Shimmo et al. | 264/1.31 |
| 2003/0060519 A1* | 3/2003 | Poco et al. | 516/98 |
| 2003/0087577 A1 | 5/2003 | Browning et al. | |
| 2003/0212152 A1 | 11/2003 | Ratke et al. | |
| 2004/0022691 A1 | 2/2004 | Allen et al. | |
| 2004/0137729 A1 | 7/2004 | Norman | |
| 2005/0082700 A1* | 4/2005 | Deeman et al. | 264/2.5 |
| 2007/0009968 A1* | 1/2007 | Cunningham et al. | 435/7.9 |
| 2008/0011934 A1* | 1/2008 | Verschuuren et al. | 249/134 |
| 2010/0165442 A1 | 7/2010 | Tung et al. | |

OTHER PUBLICATIONS

Poco et al., Synthesis of high porosity, monolithic alumina aerogels, Chemistry and Material Science Department, Journal of non-crystallie solids 285 (2001) 57-63.*

Jo et al., SiO2 aerogel film as a novel intermetal dielectric, J.Appl. Phys. 82(3), Aug. 1, 1997, pp. 1299-1304.*

Yoldas et al., Chemical Engineering of Aerogel Morphology formed under . . . , published by American Chemical Society, Chem.Mater., vol. 12, No. 8 (2000), pp. 2475-2484.*

Patel et al., An overview of Silica aerogel, Oct. 2009, pp. 1052-1057.*

Ryuji Yokokawa et al., Mechanical properties of aerogel-like thin films used for MEMS. Journal of Micromechanics and Microengineering, 2004, vol. 14, p. 681-686.

M.F. Bertino et al., High resolution patterning of silica aerogels. Journal of Non-Crystalline Solids, 2004, vol. 333, p. 108-110.

F. Blaschta et al., SiO2 aerogel ultra low k dielectric patterning using different hard mask concepts and stripping processes. Microelectronic Engineering, 2004, vol. 76, p. 8-15.

Shih-Kang Fan et al, MEMS with Thin-Film Aerogel. Technical Digest from the 14th IEEE International Conference on Micro Electro Mechanical Systems, Interlaken, Switzerland, Jan. 21-25, 2001. IEEE Catalog No. 01CH37090, ISBN: 0-7803-5998-4.

Hrubesh, "Thin Aerogel Films for Optical, Thermal, Acoustic and Electronic Applications", "Journal of Non-Crystalline Solids", Sep. 30, 1994, pp. 46-53, vol. 188, Publisher: Elsevier Science.

Kim, Gun S. and Sang H. Hyun, "Synthesis and Characterization of Silica Aerogel Films for Inter-Megal Dielectrics via Ambient Drying", "Thin Solid Films", 2004, pp. 190-200, vol. 460, Publisher: Elsevier B.V.

Kistler, "Coherent Expanded Aerogels and Jellies", "Nature", May 16, 1931, p. 741 vol. 127, No. 3211, Publisher: Nature Publishing Group.

Mayer, "TEM Sample Preparation and FIB-Induced Damage", "MRS Bulletin", May 2007, pp. 400-407, vol. 32.

Moberlychan, "Fundamentals of Focused Ion Beam Nanostructural Processing: Below, At, and Above the Surface", "MRS Bulletin", May 2007, pp. 424-432, vol. 32.

Norris, Pamela M. and Sushil Shrinivasan, "Aerogels: Unique Material, Fascinating Properties and Unlimited Applications", "Annual Review of Heat Transfer", 2005, pp. 385-408, vol. 14, Publisher: Begell House, Inc.

Prakash et al., "Silica Aerogel Films Prepared at Ambient Pressure by Using Surface Derivatization to Induce Reversible Drying Shrinkage", "Letters to Nature", Mar. 30, 1995, pp. 439-443, vol. 374, Publisher: Nature.

Richter et al., "Aerogels: Applications, Structure, and Heat Transfer Phenomena", "Annual Review of Heat Transfer Ch. 2", 1995, pp. 61-114, vol. 6, Publisher: Begell House, Inc.

Volkert, "Focused Ion Beam Microscopy and Micromachining", "MRS Bulletin", May 2007, pp. 389-399, vol. 32.

European Patent Office, "Office Action", "from Foreign Counterpart of U.S. Appl. No. 12/017,944", Sep. 3, 2013, pp. 1-7, Published in: EP.

Sun et al, "Ultrafast laser micromachining of silica aerogels", "Journal of Non-Crystalline Solids", Mar. 1, 2001, pp. 39-47, vol. 281, No. 1-3.

Japan Patent Office, "Notification of Reasons for Rejection", "from Foreign Counterpart of U.S. Appl. No. 12/017,944", May 30, 2013, pp. 1-4, Published in: JP.

U.S. Patent and Trademark Office, "Notice of Allowance", U.S. Appl. No. 12/940,348, Apr. 12, 2012.

U.S. Patent and Trademark Office, "Office Action", U.S. Appl. No. 12/940,348, Mar. 6, 2012.

U.S. Patent and Trademark Office, "Notice of Allowance", U.S. Appl. No. 12/940,348, Jul. 5, 2012.

Japanese Patent Office, Office Action from JP Application No. 2009-008849 dated Dec. 3, 2013, from Foreign Counterpart of U.S. Appl. No. 12/017,944, Dec. 3, 2013, pp. 1-4, Published in: JP.

Japanese Patent Office, Notice of Allowance from JP Application No. 2009-008849 mailed Jun. 3, 2014, from Foreign Counterpart of U.S. Appl. No. 12/017,944 , Jun. 3, 2014, pp. 1-4, Published in: JP.

* cited by examiner

AEROGEL-BASES MOLD FOR MEMS FABRICATION AND FORMATION THEREOF

FIELD OF THE INVENTION

The invention relates to an aerogel-based mold useful in the creation of a microelectromechanical features. Further, the invention relates to methods of forming an aerogel-based mold and methods of fabricating a microelectromechanical feature using an aerogel-based mold.

BACKGROUND OF THE INVENTION

Microfabrication techniques used to generate structures in microelectromechanical systems (MEMS) generally involve direct patterning of the material layer into which a MEMS structure is formed. Methods used include photolithography, laser etching, plasma etching, focused ion-beam writing, electron-beam writing, and the like. These processes can consume immense time. Photolithography, for example, requires complicated masking procedures and precise control of the etching rates of various etchants. Other methods, such as focused ion-beam writing, laser etching, and electron-beam writing, largely obviate the need for complex masking procedures. Nevertheless, using these techniques to direct-write a MEMS structure into a material layer can still require immense time because of the quantity of matter that must be ablated from the material layer.

SUMMARY OF THE INVENTION

Embodiments of the present invention are directed to materials and methods that reduce the time required to form a patterned material layer, and thus reduce the time required to fabricate a microelectromechanical feature.

A patterned aerogel-based layer serves as a mold for a microelectromechanical feature. The density of the aerogel-based material is less than that of typical materials used in MEMS fabrication, such as poly-silicon, silicon oxide, single-crystal silicon, metal, metal alloys, and the like. Therefore, one may form structural features in the aerogel-based layer at rates significantly higher than the rates at which structural features can be formed in denser materials. This permits one to pattern an outline of a microelectromechanical feature into the aerogel-based layer in much less time than would be required to pattern a similar microelectromechanical feature into denser materials.

The invention further includes a method of patterning an aerogel-based layer to produce such a mold. This method includes using techniques that may direct-write fine-scale device features, such as microelectromechanical features, into an aerogel-based layer.

The invention further includes a method of fabricating a microelectromechanical feature using an aerogel-based mold. This method includes the deposition of a dense material layer directly onto an aerogel-based layer having a structural feature whose surface contour is substantially the same as the surface contour of at least part of a microelectromechanical feature. This results in a microelectromechanical feature whose structural stability and mechanical integrity are sufficient to permit a MEMS apparatus formed therefrom to function in an analogous manner to a MEMS apparatus whose features are formed by direct-writing into a dense material, such as silicon or silicon oxide.

DETAILED DESCRIPTION

The following section describes the invention in further detail, and illustrates particular embodiments of the invention. This description also illustrates particular embodiments of the terms used in the claims. In both instances, these particular embodiments are offered for illustrative purposes, and are not to be used to limit the scope of the claimed invention. This detailed description provides limiting definitions of several terms, which are identified by express definitional language, i.e., "X is defined as Y." Unless such express definitional language appears in a description, the description is presumed to be illustrative and non-limiting.

Unless expressly defined, all technical and scientific terms used herein have the same meaning as commonly understood by one of ordinary skill in the art to which this invention belongs.

All publications, patent applications, patents, and other references mentioned herein, if not otherwise indicated, are explicitly incorporated by reference herein in their entirety for all purposes as if fully set forth in the present specification.

Unless otherwise stated, all percentages, parts, ratios, etc., are by weight.

When an amount, concentration, or other parameter is given as a range, or a list of upper and lower values, this is to be understood as specifically disclosing all ranges formed from any pair of any upper and lower range limits, regardless of whether ranges are separately disclosed. Where a range of numerical values is recited herein, unless otherwise stated, the range is intended to include the endpoints thereof, and all integers and fractions within the range. It is not intended that the scope of the present invention be limited to the specific values recited when defining a range.

When the term "about" is used in describing a value or an end-point of a range, the invention should be understood to include the specific value or end-point referred to.

As used herein, the terms "comprises," "comprising," "includes," "including," "has," "having," or any other variation thereof, are intended to cover a non-exclusive inclusion. For example, a process, method, article, or apparatus that comprises a list of elements is not necessarily limited to only those elements but can include other elements not expressly listed or inherent to such process, method, article, or apparatus. Further, unless expressly stated to the contrary, "or" refers to an inclusive or and not to an exclusive or. For example, a condition "A or B" is satisfied by any one of the following: A is true (or present) and B is false (or not present); A is false (or not present) and B is true (or present); and both A and B are true (or present).

The use of "a" or "an" to describe the various elements and components herein is merely for convenience and to give a general sense of the invention. This description should be read to include one or at least one, and the singular also includes the plural unless it is obvious that it is meant otherwise.

As used herein, the following terms are defined as follows. These definitions apply to the use of these terms within all portions of the application, including the claims.

An "aerogel" is defined as a low-density solid-state material resulting from the substantial removal of liquid from an alcogel without substantially damaging the solid part, such that the resulting solid retains at least about 50% of the volume of the alcogel. According to this definition, an aerogel need not consist entirely of a single chemical composition, such as a pure silicon oxide aerogel, but may also include combinations of multiple gel-forming compositions, such as a silicon titanium oxide aerogel, and the like. An aerogel may also include additives and/or impurities, as long as the presence of the additives and/or impurities does not inhibit formation of an alcogel or inhibit the subsequent conversion of the alcogel into an aerogel. According to this definition, an aerogel need not have uniform composition throughout.

An "alcogel" is defined as a substantially rigid structure that results when a sol substantially reaches its gel point. The sol comprises reactants (typically, though not exclusively, metal oxides) that undergo chemical reactions leading to the generation of species of continuously increasing molecular weight. As these species increase in molecular weight, they link together so as to form a three-dimensional network. At or near the gel point, the three-dimensional network substantially spans the volume of the sol, so as to yield a substantially rigid structure, an alcogel.

An "aerogel-based material" is defined as a material comprising an aerogel, where a substantial portion of the gaseous volume of the aerogel remains unoccupied by other non-gaseous material. An aerogel-based material, according to this definition, may include composites of an aerogel with other materials and/or compositions, so long as the other materials and/or compositions are present in quantities such that a substantial portion of the gaseous volume of the aerogel remains unoccupied by other non-gaseous material. An aerogel-based material, as defined herein, need not be compositionally uniform throughout, so long as a substantial portion of the gaseous volume of the aerogel remains unoccupied by other non-gaseous material.

An "aerogel-based layer" is defined as a layer, or a sublayer or region within a layer, substantially comprising an aerogel-based material.

A "substrate" is a material layer that underlies the material layer that comprises the aerogel-based layer, and provides structural support. The material layer comprising the aerogel-based layer need not maintain direct physical contact with the substrate. For example, intervening layers or sublayers may or may not be present.

As used in reference to an aerogel-based layer, a "thickness" is defined as the distance between a top extension of the aerogel-based layer and a bottom extension of the aerogel-based layer, as measured before the aerogel-based layer is subjected to writing, where the measurement occurs on an axis perpendicular to the substrate.

As used herein, "writing" is defined as a single-step or multi-step process which results in the net ablation of matter from one or more material layers. The invention is not limited to any particular ablation method except to exclude ablation methods that result in structural failure of the aerogel-based layer.

A "structural feature" is a feature resulting from writing into one or more material layers.

As used herein, a "surface contour" is defined as the surface geometry of a feature in terms of the relative three-dimensional positioning of the surface characteristics of the feature. Therefore, when the surface contours of two features are compared (for example, to say that the surface contour of one feature is substantially the same as the surface contour of another feature), this comparison is based only on the relative positioning of surface characteristics within each feature. Comparison of the surface contours of two or more features, thus, excludes all consideration of absolute size. As used herein, the phrase will generally refer either to a surface contour of a structural feature formed, at least in part, by ablation of an aerogel layer, or to at least a part of a microelectromechanical feature.

As used herein, a "microelectromechanical feature" is defined as a feature that forms at least a part of a mechanical, electromechanical, or opto-electromechanical apparatus, where the largest linear dimension of the feature, drawn along any axis, is no longer than about 1 mm and no smaller than about 100 nm. The invention is not limited in scope to any particular type of apparatus, feature, or part thereof, so long as the feature has the established size restrictions and is capable of performing a mechanical, electromechanical, or opto-electromechanical function.

As used herein in reference to a dense material layer, "depositing" is defined as a method of forming a layer of a material onto a surface. The invention is not limited to any particular technique for forming a material layer, except to exclude techniques that would result in non-trivial degradation of the aerogel-based layer or that would result in the structural failure of the aerogel-based layer.

As used herein, "dense material layer" is defined as a material layer having no more than about 50% gas by volume. According to this definition, the volume occupied by interstitial points in the crystal structure are considered to be occupied by gas.

As used herein in reference to an aerogel-based layer, "removing" is defined as a method of stripping away the aerogel-based material. The invention is not limited to any particular stripping technique, except to exclude techniques that would result in non-trivial degradation of any dense material layer or layers deposited over the aerogel-based layer.

An aerogel-based layer may be formed on a substrate by any technique known to those of skill in the art. The invention need not be limited by the means in which the aerogel-based layer is formed. In one embodiment, the aerogel layer consists of a silicon oxide aerogel deposited onto a substrate by methods disclosed in the following references: G. S. Kim & S. H. Hyun, Thin Solid Films, Vol. 460, pp. 190-200 (2004); S. S. Kistler, Nature, Vol. 127, p. 741 (1931); P. M. Norris & S. Shrinivasan, Ann. Rev. Heat Transfer, Vol. 14, pp. 385-408 (2005, V. Prasad, et al., eds.); S. S. Prakash, et al., Nature, Vol. 374, pp. 439-43 (1995); K. Richter, et al., Ann. Rev. Heat Transfer, Vol. VI, pp. 61-114 (1996); L. W. Hrubesh & J. F. Poco, J. Non-Crystalline Solids, Vol. 188, pp. 46-53 (1995); each incorporated herein by reference in their entirety.

An aerogel of the invention may comprise any material composition capable of forming an aerogel, as defined above. In one embodiment, the aerogel comprises a metal oxide. In another embodiment, the aerogel comprises one or more metal oxides selected from the group consisting of silicon oxide, aluminum oxide, chromium oxide, titanium oxide, and tin oxide. In another embodiment, the aerogel comprises silicon oxide. In a further embodiment, the aerogel comprises at least 95% silicon oxide by mass.

An aerogel of the invention has no particular density, as the density will vary depending on the aerogel's chemical composition and the fraction of its volume occupied by a gas. In one embodiment, the density of the aerogel is between about 1 and about 500 kg m$^3$. In another embodiment, the density of the aerogel is between about 3 and about 400 kg m$^3$. In another embodiment, the density of the aerogel is between about 5 and about 100 kg m$^3$.

An aerogel of the invention has no particular restriction on the fraction of its volume that is occupied by a gas. In one embodiment, the aerogel is more than about 50% gas by volume. In another embodiment, the aerogel is more than about 70% gas by volume. In another embodiment, the aerogel is more than about 85% gas by volume. In another embodiment, the aerogel is more than about 90% gas by volume. In another embodiment, the aerogel is more than about 95% gas by volume. In another embodiment, the aerogel is more than about 97% gas by volume.

An aerogel-based layer of the invention may have any thickness less than about 1 mm. In one embodiment, the aerogel-based layer has a thickness between about 100 nm and about 1 mm. In another embodiment, the aerogel-based layer has a thickness between about 500 nm and about 750 μm. In another embodiment, the aerogel-based layer has a thickness between about 1 μm and about 600 μm.

A writing process of the invention includes the use of any ablation methods known to those of skill in the art except for those methods whose use would result in structural failure of the aerogel-based layer. In one embodiment, the ablation method comprises the use of at least one technique selected from the group consisting of focused ion-beam writing, plasma etching, laser ablation, reactive ion etching, and other like dry etching techniques. In one embodiment, the ablation method comprises the use of focused ion-beam writing, where the focused ion beam apparatus is equipped with an electron shower. See C. A. Volkert & A. M. Minor, MRS Bulletin, Vol. 32, pp. 389-95 (2007); W. J. Moberly-Chan et al., MRS Bulletin, Vol. 32, pp. 424-32 (2007); J. Mayer, et al., MRS Bulletin, Vol. 32, pp. 400-07 (2007); each incorporated herein by reference.

In one embodiment, writing occurs through a single-step process wherein an aerogel-based layer is subjected to an energy source which ablates matter from the aerogel-based layer to form a structural feature having a surface contour that is substantially the same as a surface contour of at least a part of a microelectromechanical feature.

In another embodiment, writing occurs through a two-step process. In a first step, an aerogel-based layer is subjected to an energy source which ablates matter from the aerogel-based layer to form a first structural feature. In a second step, matter is deposited into or onto the first structural feature to form second structural feature, wherein the volume of matter deposited in the second step is less than the volume of matter ablated in the first step, and wherein the second structural feature has a surface contour that is substantially the same as a surface contour of at least a part of a microelectromechanical feature. In other embodiments, writing may occur through single-step or multi-step processes.

Figure 2:
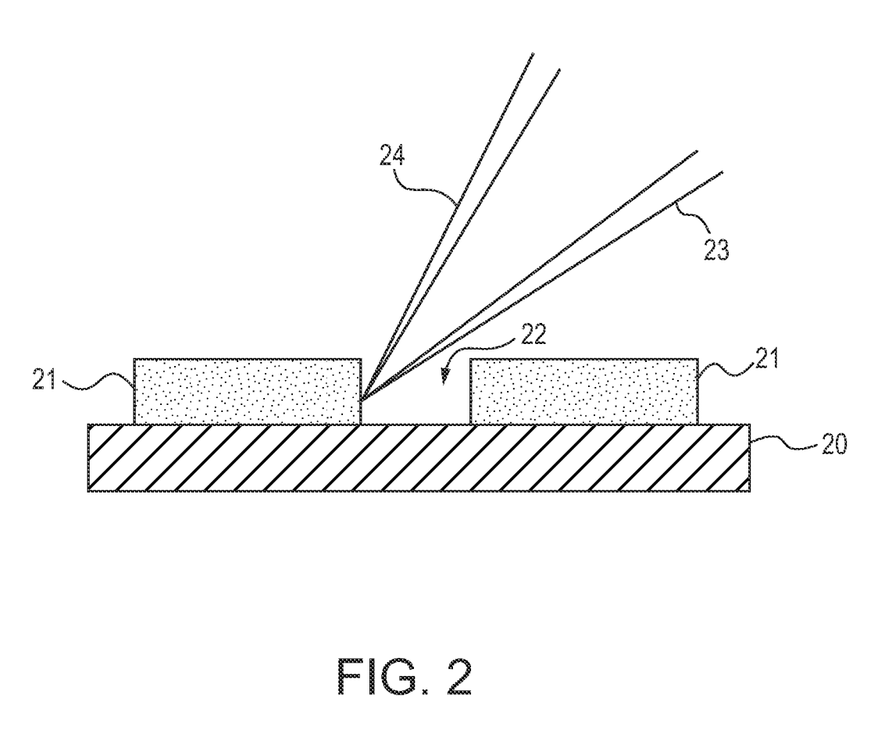
FIG. 2 depicts the use of a focused ion beam to direct-write a MEMS-scale cavity directly into an aerogel layer.

In some embodiments, an aerogel-based layer lies directly over a substrate and the writing step ablates the aerogel-based layer so as to expose a portion of the surface of the underlying substrate, as shown, for example, in FIG. 2. In other embodiments, an aerogel-based layer lies directly over a substrate and the writing step ablates the aerogel-based layer so as not to expose a portion of the surface of the underlying substrate. In yet other embodiments, additional layers may lie between the aerogel-based layer and the substrate. In these embodiments, the writing step at least ablates matter from the aerogel-based layer (either exposing or not exposing a surface portion of the underlying layer), but may also ablate matter from the layer(s) lying between the substrate and the aerogel-based layer (either exposing or not exposing a portion of the surface of the substrate).

A microelectromechanical feature of the invention is not limited to any particular type of feature, so long as it is encompassed by the above definition. For a single-feature microelectromechanical apparatus, the microelectromechanical feature may constitute the entire microelectromechanical apparatus. For a multiple-feature microelectromechanical apparatus, the microelectromechanical feature constitutes merely part of the microelectromechanical apparatus. In one embodiment, the microelectromechanical feature is physically and/or electrically isolated from any other microelectromechanical feature or apparatus; for example, a grating. In another embodiment, the microelectromechanical feature is physically and/or electrically connected to another microelectromechanical feature or apparatus, or any other apparatus; for example, a fluid mixer that is connected to a flow channel.

In one embodiment, the microelectromechanical apparatus is a fluid mixer. In another embodiment, the microelectromechanical apparatus is a grating. In another embodiment, the microelectromechanical apparatus is a flexing diaphragm.

A depositing process of the invention includes the use of any method of forming a material layer onto a surface, except to exclude techniques that would result in non-trivial degradation of the aerogel-based layer, or that would result in the structural failure of the aerogel-based layer. The depositing process may consist of a single step or multiple steps.

In one embodiment, the depositing process comprises the use of at least one technique selected from the group consisting of chemical vapor deposition, sputtering, evaporation, and low-pressure chemical vapor deposition.

A dense material layer of the invention comprises a material that is less than about 50% gas by volume. In one embodiment, the dense material comprises a material that is less than about 40% gas by volume. In another embodiment, the dense material comprises a material that is less than about 35% gas by volume. In another embodiment, the dense material comprises a material that is less than about 32% gas by volume.

A dense material layer of the invention is not restricted to any particular chemical composition, so long as the composition is suitable for use in a microelectromechanical feature. In one embodiment, the dense material layer comprises a material selected from the group consisting of silicon dioxide, gold, platinum, and poly-silicon.

In one embodiment, the dense material layer has an average density that is about 20% greater than the average density of the aerogel-based layer. In another embodiment, the dense material layer has an average density that is about 35% greater than the average density of the aerogel-based layer. In another embodiment, the dense material layer has an average density that is about 50% greater than the average density of the aerogel-based layer. In another embodiment, the dense material layer has an average density that is about double the average density of the aerogel-based layer. In another embodiment, the dense material layer has an average density that is about triple the average density of the aerogel-based layer. In another embodiment, the dense material layer has an average density that is about five times the average density of the aerogel-based layer. In another embodiment, the dense material layer has an average density that is about ten times the average density of the aerogel-based layer. In another embodiment, the dense material layer has an average density that is about 25 times the average density of the aerogel-based layer. In another embodiment, the dense material layer has an average density that is about 50 times the average density of the aerogel-based layer.

The deposition of the dense material layer need not directly follow the writing of a structural feature into an aerogel-based layer. In one embodiment, the writing of a structural feature into an aerogel-based layer is followed by a process or series of processes that prepares the patterned aerogel-based layer for the depositing of a dense material layer. For example, the aerogel-based layer may be subjected to any surface preparation technique known to those of skill in the art as long as the surface preparation would not result in the structural failure of the aerogel-based layer. In some embodiments, however, the depositing of a dense material layer directly follows the writing of a structural feature into an aerogel-based layer.

A removing process of the invention includes any technique suitable for stripping away the aerogel-based layer excluding techniques that would result in non-trivial degradation of any dense material layers deposited over the aerogel-based layer. In one embodiment, the removing process comprises exposing the aerogel-based layer to at least one agent selected from the group consisting of water, an aqueous etchant, and a gaseous etchant.

One aspect of the invention is directed to an aerogel-based mold useful in the fabrication of at least part of a microelectromechanical feature. This aspect of the invention includes an aerogel-based layer deposited onto a substrate, wherein the aerogel layer has a thickness of less than about 1 mm, and comprises a structural feature having a surface contour that is substantially the same as a surface contour of at least a part of a microelectromechanical feature.

Figure 1:
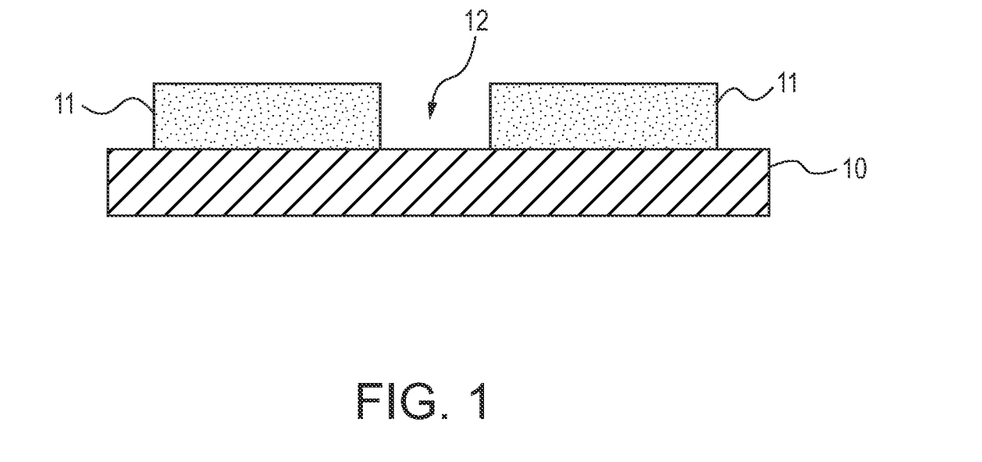
FIG. 1 depicts an aerogel-based layer into which a MEMS-scale cavity has been created.

FIG. 1 depicts one embodiment of this aspect of the invention. An aerogel-based layer 11 has been formed on a substrate 10, and an outline of a MEMS-scale cavity 12 has been patterned directly into the aerogel-based layer.

Another aspect of the invention is directed to a method of forming an aerogel-based mold useful in the fabrication of at least part of a microelectromechanical feature. The method includes (a) providing a substrate having an aerogel-based layer thereon, wherein the aerogel-based layer has a thickness less than about 1 mm; and (b) writing a structural feature into the aerogel-based layer, wherein the structural feature has a surface contour that is substantially the same as a surface contour of at least a part of a microelectromechanical feature.

FIG. 2 depicts one embodiment of this aspect of the invention. An aerogel-based layer 21 has been formed on a substrate 20. A focused gallium ion beam 23 coupled with an electron shower 24 is used to ablate matter from the aerogel-based layer 21 to form an outline of a MEMS-scale cavity 22.

Another aspect of the invention is directed to a method of fabricating at least a part of a microelectromechanical feature. The method includes (a) providing a substrate having an aerogel-based layer thereon, wherein the aerogel-based layer has a thickness less than about 1 mm; (b) creating a structural feature in the aerogel-based layer, wherein the structural feature has a surface contour that is substantially the same as a surface contour of at least a part of a microelectromechanical feature; and (c) depositing a dense material layer over the aerogel-based layer to form at least part of a microelectromechanical feature.

Figure 3:
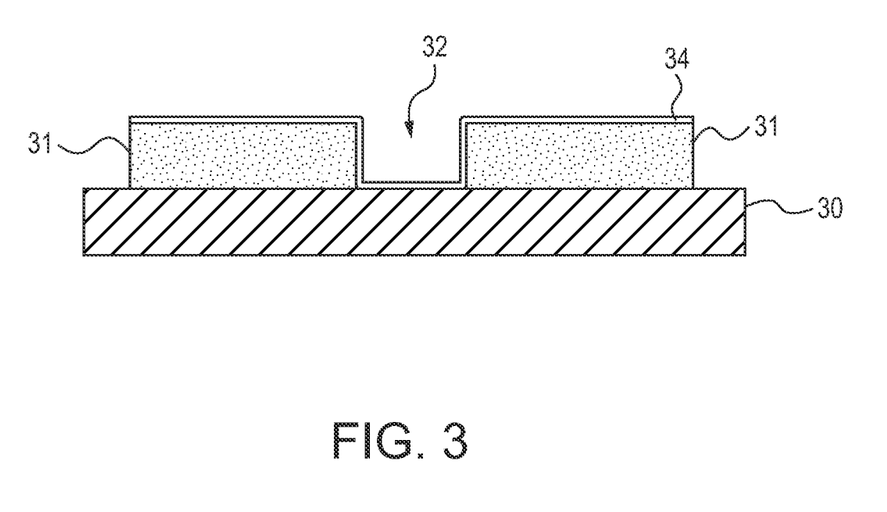
FIG. 3 depicts a MEMS-scale cavity formed by depositing a dense material layer directly onto a patterned aerogel layer.

FIG. 3 depicts one embodiment of this aspect of the invention. An aerogel-based layer 31 has been deposited onto a substrate 30. An outline of a MEMS-scale cavity 32 has been written into the aerogel-based layer 31, and a dense material layer 34 has been deposited over the aerogel-based layer 31.

The embodiments depicted in FIGS. 1-3 are offered for illustrative purposes only. The figures are not intended to be a source of any definitions of terms used in the claims, and are also not intended to limit the scope of claim terms in any manner. Furthermore, the relative scale of various elements of each figure are selected for ease of presentation, and may or may not be indicative of the relative scale of those same elements in actual embodiments of the claimed invention.

I claim:

1. A mold for creating device structures comprising:
a substrate;
a removable aerogel-based layer over a portion of the substrate, wherein the aerogel-based layer:
comprises an aerogel that is at least about 95% gas by volume;
has thickness between about 100 nm and about 1 mm; and
comprises a metal oxide and a structural feature having a surface contour that is substantially the same as a surface contour of at least part of a microelectromechanical feature; and
a dense material layer over the surface contour of the structural feature of the aerogel-based layer, wherein a portion of the dense material layer is directly attached to another portion of the substrate, the dense material layer comprising at least part of the microelectromechanical feature;
wherein the aerogel-based layer is removable from the substrate without substantial degradation of the dense material layer.

2. The mold according to claim 1 wherein:
the aerogel comprises silicon oxide.

3. The mold according to claim 1 wherein:
the thickness is between about 1 μm and about 1 mm.

4. A method of forming a mold for a microelectromechanical feature comprising the steps of:
(a) forming a removable aerogel-based layer over a portion of a substrate, wherein the aerogel-based layer comprises an aerogel that is at least about 95% gas by volume and has a thickness between about 100 nm and about 1 mm, the aerogel-based layer comprising a metal oxide;
(b) writing a structural feature into the aerogel-based layer, wherein the structural feature has a surface contour; and
(c) depositing a dense material layer over the aerogel-based layer to form at least part of a microelectromechanical feature, wherein a portion of the dense material layer is directly attached to another portion of the substrate.

5. The method according to claim 4 wherein:
the aerogel comprises silicon oxide.

6. The method according to claim 4 wherein:
the writing comprises the use of at least one technique selected from the group consisting of focused ion beam writing, plasma etching, laser ablation, and reactive ion etching.

7. The method according to claim 4 wherein:
the writing comprises the use of focused ion beam writing.

8. The method according to claim 4 wherein:
the thickness is between about 1 μm and about 1 mm.

9. The mold according to claim 1 wherein:
the aerogel comprises aluminum oxide.

10. The mold according to claim 1 wherein:
the aerogel comprises chromium oxide.

11. The mold according to claim 1 wherein:
the aerogel comprises titanium oxide.

12. The mold according to claim 1 wherein:
the aerogel comprises tin oxide.

13. The mold according to claim 1 wherein:
the dense material layer comprises silicon dioxide or polysilicon.

14. The mold according to claim 1 wherein:
the dense material layer comprises gold or platinum.

15. The mold according to claim 1, wherein the surface contour of the structural feature corresponds to a surface contour of a microelectromechanical apparatus comprising a fluid mixer, a grating, or a flexing diaphragm.

16. A mold for creating microelectromechanical device structures comprising:
a substrate;

a removable aerogel-based layer over a portion of the substrate, the aerogel-based layer comprising an aerogel that is at least about 95% gas by volume, and one or more metal oxides selected from the group consisting of silicone oxide, aluminum oxide, chromium oxide, titanium oxide, and tin oxide;

wherein the aerogel-based layer includes a structural feature having a surface contour that is substantially the same as a surface contour of at least part of a microelectromechanical feature; and a dense material layer over the surface contour of the structural feature of the aerogel-based layer, wherein a portion of the dense material layer is directly attached to another portion of the substrate, the dense material layer comprising at least part of the microelectromechanical feature.

* * * * *

UNITED STATES PATENT AND TRADEMARK OFFICE
CERTIFICATE OF CORRECTION

PATENT NO. : 8,851,442 B2  
APPLICATION NO. : 12/017944  
DATED : October 7, 2014  
INVENTOR(S) : Carlson Page 1 of 1

It is certified that error appears in the above-identified patent and that said Letters Patent is hereby corrected as shown below:

At the Title page, item (54) and in the Specification, Column 1, title, replace "AEROGEL-BASES MOLD FOR MEMS FABRICATION AND FORMATION THEREOF" with --AEROGEL-BASED MOLD FOR MEMS FABRICATION AND FORMATION THEREOF--.

In the Claims

At Column 9, Lines 4-5, replace "silicone oxide" with --silicon oxide--.

Signed and Sealed this  
Sixteenth Day of June, 2015

Michelle K. Lee  
*Director of the United States Patent and Trademark Office*